United States Patent
Santiago Berríos et al.

(10) Patent No.: US 9,505,618 B2
(45) Date of Patent: Nov. 29, 2016

(54) SYNTHESIS AND CHARACTERIZATION OF LEAD SELENIDE CAPPED WITH A BENZOATE LIGAND

(71) Applicants: Mitk'El B. Santiago Berríos, Caguas, PR (US); Weyshla A. Rodríguez Rodríguez, Caguas, PR (US)

(72) Inventors: Mitk'El B. Santiago Berríos, Caguas, PR (US); Weyshla A. Rodríguez Rodríguez, Caguas, PR (US)

(73) Assignee: Ana G. Méndez University System, San Juan, PR (US)

( * ) Notice: Subject to any disclaimer, the term of this patent is extended or adjusted under 35 U.S.C. 154(b) by 0 days.

(21) Appl. No.: 14/555,567

(22) Filed: Nov. 26, 2014

(65) Prior Publication Data

US 2015/0329359 A1 Nov. 19, 2015

Related U.S. Application Data

(60) Provisional application No. 61/909,770, filed on Nov. 27, 2013.

(51) Int. Cl.
*C01B 19/00* (2006.01)
*C01B 19/04* (2006.01)
*H01L 31/0272* (2006.01)

(52) U.S. Cl.
CPC ......... *C01B 19/007* (2013.01); *H01L 31/0272* (2013.01); *C01P 2002/72* (2013.01); *C01P 2002/82* (2013.01); *C01P 2004/03* (2013.01); *C01P 2006/40* (2013.01); *Y02P 20/134* (2015.11)

(58) Field of Classification Search
CPC . C01G 19/00; C01G 19/007; C01G 19/1904
See application file for complete search history.

(56) References Cited

U.S. PATENT DOCUMENTS 9,082,982 B2 * 7/2015 Jun ........................ C09K 11/02
2013/0048922 A1 2/2013 Zhou

FOREIGN PATENT DOCUMENTS

WO WO 2012112899 A1 * 8/2012 ............... B32B 5/16

* cited by examiner

*Primary Examiner* — Timothy Vanoy
(74) *Attorney, Agent, or Firm* — Walter O. Alomar-Jiménez, Esq.; DBPR Legal, LLC

(57) ABSTRACT

Semiconductor materials offer several potential benefits as active elements in the development of harvesting-energy conversion technologies. In particular, lead selenide (PbSe) semiconductors have been used and proposed to design solar energy harvesting devices, IR sensors, FET devices, amongst others. The present disclosure provides a simple, low cost synthesis of lead selenide using benzoic acid as the capping ligand in an opened environment. The use of an aromatic ligand, and mores specifically benzoic acid, provides robustness and more durability to the lead selenide, and therefore prevents the lead selenide from breaking or cracking easily. Also the aromatic ligand prevents the degradation and oxidation of the lead selenide, without affecting any of the lead selenide electronic and chemical characteristics.

20 Claims, 3 Drawing Sheets

SYNTHESIS AND CHARACTERIZATION OF LEAD SELENIDE CAPPED WITH A BENZOATE LIGAND

STATEMENT REGARDING FEDERALLY SPONSORED RESEARCH AND DEVELOPMENT

This work was supported by the Institute for Functional Nanomaterials under the PR-EPSCoR program (NSF Grant No. EPS-1002410) and NSF Grant No. CBET-1126339.

RELATED APPLICATIONS

Provisional application No. U.S. 61/909,770 filed on Nov. 27, 2013.

BACKGROUND OF THE DISCLOSURE

Field of the Disclosure

The present invention relates to a method for synthesizing lead selenide using aromatic ligands, and more specifically the present invention relates to a method for synthesizing lead selenide using benzoic acid in an opened environment. Said lead selenide is used in the manufacturing of IR detectors, semiconductors, solar cells, amongst others.

DEFINITIONS

Closed environment: a reaction carried in an inert environment, without the presence of oxygen and moisture in the air. Usually the reaction vessel is filled with an inert gas such as nitrogen or argon. The inert gas prevents unwanted chemical reactions with the sample such as oxidation and hydrolysis, which are reactions with the oxygen and moisture in air.
Opened environment: a reaction carried in the presence of the oxygen and moisture in the air. The reaction vessel does not need to be filled with an inert gas.

Discussion of the Background

Semiconductor materials offer several benefits as active elements in the development of the next-generation technologies for solar energy conversion. The systematic design of a solar energy harvesting device requires an understanding of the chemistry of the counterparts of the device. For instance, semiconductor thin films offer an efficient light capture due to the high absorption cross section of the inorganic materials. However, they have not yet been successfully used for the construction of a hybrid interface sufficiently robust and efficient for industrial applications. Among the various semiconductors under investigation, lead salts, particularly quantum dots have drawn particular attention from the applied and fundamental research communities, primarily for its exceptionally strong quantum confinement effects.

Lead salts, particularly lead selenide (PbSe) and lead sulfur (PbS) have shown interesting properties that make them suitable for these applications. Among these properties are their potential as fluorophores and the narrow bad gap that these materials exhibit. Other reason why lead salts have attracted such interest is that these materials absorb in the infrared region, which represents almost 50% of the solar spectrum, allowing them to be used in solar cells, FET devices, and other devices. Recently, PbSe quantum dots (QD) have attracted greater interest because they absorb in the mid-infrared region, while having a low effective mass and large exciton Bohr radius.

To increase the rate of charge transfer mechanisms between the semiconductor core and the ligands that are attached to the surface of these particles in solar energy harvesting devices, several methods have been proposed using mainly ligand exchange methods after the synthesis of the semiconductor. Most of the solar energy harvesting devices and optoelectronic applications have shown that the conduction across the different components of the device can be inhibited by long insulating organic ligands that are used during the synthesis, for example trioctylphosphine and oleic acid. Nevertheless, said synthesis requires a two-step process for a ligand exchange reaction. Because it is a two-step process, it can be expensive and time consuming, specifically due to the fact that the reaction is carried in a close environment to prevent the oxidation of the lead selenide.

Other works have used aromatic ligands in semiconductors. However, the synthesis of lead selenide semiconductors with aromatic ligands has been elusive so far. Tan and coworkers have derivatized cadmium selenide (CdSe) with thiophenol and with 4-dimethylaminothiophenol in a two-step reaction. Tan et. al observed that the aromatic ligands provide excellent protection against air and water oxidation. More recently, Debnath and coworkers prepared lead sulfide (PbS) nanoparticles with N-2,4,6-trimethylphenyl-N-methyldithiocarbamate ligands in a two-step reaction. The presence of the aromatic compound also helps to prevent air oxidation of the particle in the construction of a solar cell.

The prior art discloses methods for synthesizing lead selenide using oleic acid as the capping ligand. However, said ligand does not adequately protect the lead from oxidation. The main difference between oleic acid and benzoic acid relies on the chemical structure. Oleic acid is an 18 carbon chain with an unsaturation at the ninth carbon (see FIG. 1). Benzoic acid on the contrary is a smaller molecule with a benzene ring. Oxidation of the lead will have two primary disadvantages: i) it decreases the rate of charge transfer; and ii) it is more amenable to crack or break. Therefore, there is a need to synthesize a lead selenide which will not easily oxidize, thus providing semiconductors, solar cells, FET devices, IR detectors and others with better rate of charge transfer and more durability. The synthesis of lead selenide using oleic acid is carried in a closed environment to prevent the oxidation of the lead selenide.

The prior art also discloses the use of aromatic ligands, more particularly, thiophenol, 4-dimethylaminothiophenol and N-2,4,6-trimethylphenyl-N-methyldithiocarbamate, in a two-step process using ligand exchange methods. This means that the prior art discloses the synthesis of lead selenide in an inert, closed environment usually using an inert gas to prevent the oxidation of the lead selenide and afterwards a ligand exchange reaction with the desired aromatic ligand. Therefore, there is a need to provide a simple and low cost process to synthesize lead selenide, which can be done in an opened environment.

SUMMARY

The current disclosure presents the synthesis of PbSe using an aromatic ligand as the capping ligand in an opened environment.

The current disclosure presents the synthesis of PbSe using benzoic acid as the capping ligand in an opened environment.

Accordingly, it is an object of the present disclosure to provide a lead selenide containing aromatic ligands in the crystal structure of PbSe.

Accordingly, it is an object of the present disclosure to provide a lead selenide containing benzoic acid in the crystal structure of PbSe.

It is another object of the present disclosure to provide an aromatic ring to the lead selenide in such way that will provide robustness, more durability and prevent oxidation of the particle.

It is another object of the present disclosure to provide a benzoic acid ring to the lead selenide in such way that will provide robustness, more durability and prevent oxidation of the particle.

It is another object of the present disclosure to provide an aromatic ring to the lead selenide in such way that will provide robustness, more durability and prevent oxidation of the particle, while not affecting any of the lead selenide electronic and chemical characteristics.

It is another object of the present disclosure to provide a benzoic acid ring to the lead selenide in such way that will provide robustness, more durability and prevent oxidation of the particle, while not affecting any of the lead selenide electronic and chemical characteristics.

It is another object of the present disclosure to provide a simple and low cost process for the synthesis of lead selenide in an opened environment.

BRIEF DESCRIPTION OF THE DRAWINGS

The accompanying drawings, which are incorporated herein, constitute part of the specification and illustrate the preferred embodiment of the disclosure.

DESCRIPTION OF THE PREFERRED EMBODIMENT

Figure 1:
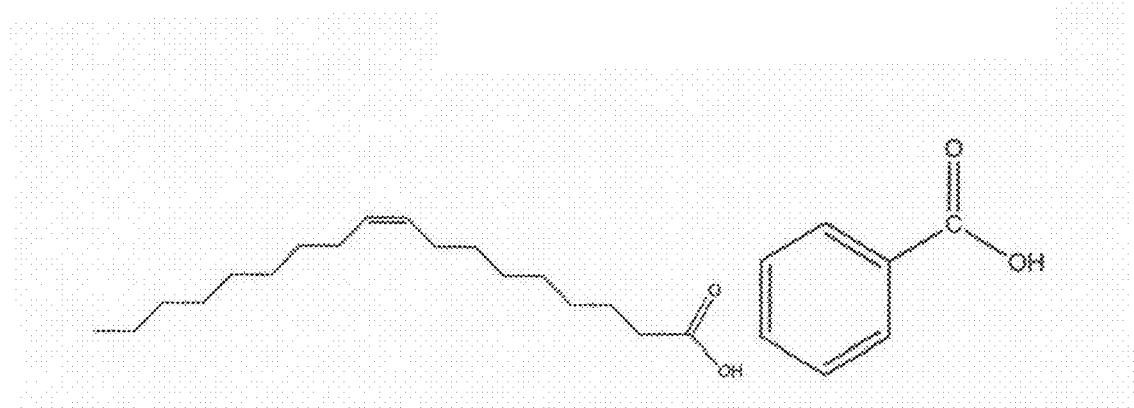
FIG. 1 shows the chemical structure of oleic acid (left) and benzoic acid (right).

Lead acetate (reagent grade) and toluene (reagent grade) were obtained from Fisher Scientific. On the other hand, the elemental selenium (99.999% pure), 1-octadecene, benzoic acid, and trioctylphosphine were obtained from Sigma-Aldrich.

The synthesis of PbSe with benzoic acid as a capping ligand is carried at about 200° C. temperature, preferably at 250° C., via nucleation (bottom-up method) in an opened environment comprising the following steps:

Step 1: In a round bottom flask stoichiometric amounts of lead acetate, preferably 3.795 grams, and recrystallized benzoic acid, preferably 1.8349 grams, are added to 40 mL of a 50:50 mixture of toluene and 1-octadecene in an opened environment. This reaction mixture is heated at about 200° C. temperature, preferably at 250° C., and maintained at constant stirring for about one hour. This generates a lead benzoate solution.

Step 2: In another round bottom flask an stoichiometric amount of selenium powder with respect to the lead acetate of Step 1, preferably 0.0690 grams, and 1.6 mL of trioctylphosphine is added to 40 mL of 1-octadecene and heated at about 200° C. temperature, preferably at 250° C., at constant stirring in an opened environment for about 20 to 30 minutes. This generates a selenide solution.

Step 3: Adding five milliliters (5 mL) of the lead benzoate solution of Step 1 into the selenide solution of Step 2 at a rate of 1 mL per 30 seconds. This generates a lead selenide with benzoic ligand and a byproduct.

Step 4: When the addition of Step 3 is completed, the byproduct is decanted and the lead selenide with benzoic ligand is centrifuged for 15 minutes with ethanol.

Step 5: The ethanol is decanted and the lead selenide with benzoic ligand were re-suspended in hexane at room temperature.

Characterization

A simple, low cost, opened environment method for synthesizing PbSe particles using benzoic acid as the capping ligand has been provided according to the principles of the present invention. The lead selenide of the present disclosure were compared with PbSe using oleic acid as the capping ligand.

Figure 2:
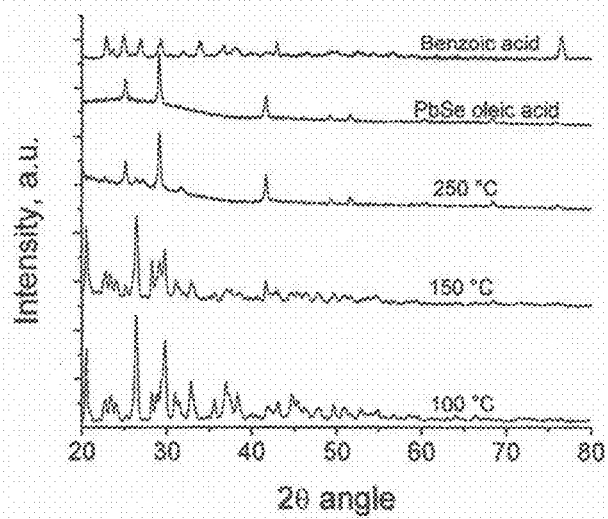
FIG. 2 shows a comparison of X-ray powder diffractograms (XRPD) between PbSe particles with benzoic acid ligands synthesized at 100° C., 150° C. and 250° C. XRPD of PbSe with oleic acid ligand and benzoic acid are also shown for comparison in accordance with the principles of the present disclosure.

In FIG. 2, we can observe that the diffraction pattern of lead selenide with benzoic acid prepared at 100° C. and 150° C. are very different from the diffraction pattern of PbSe with oleic acid. However, only the synthesis of PbSe with benzoic acid prepared at 250° C. temperature resembles the crystal structure of PbSe oleic acid.

Figure 3:
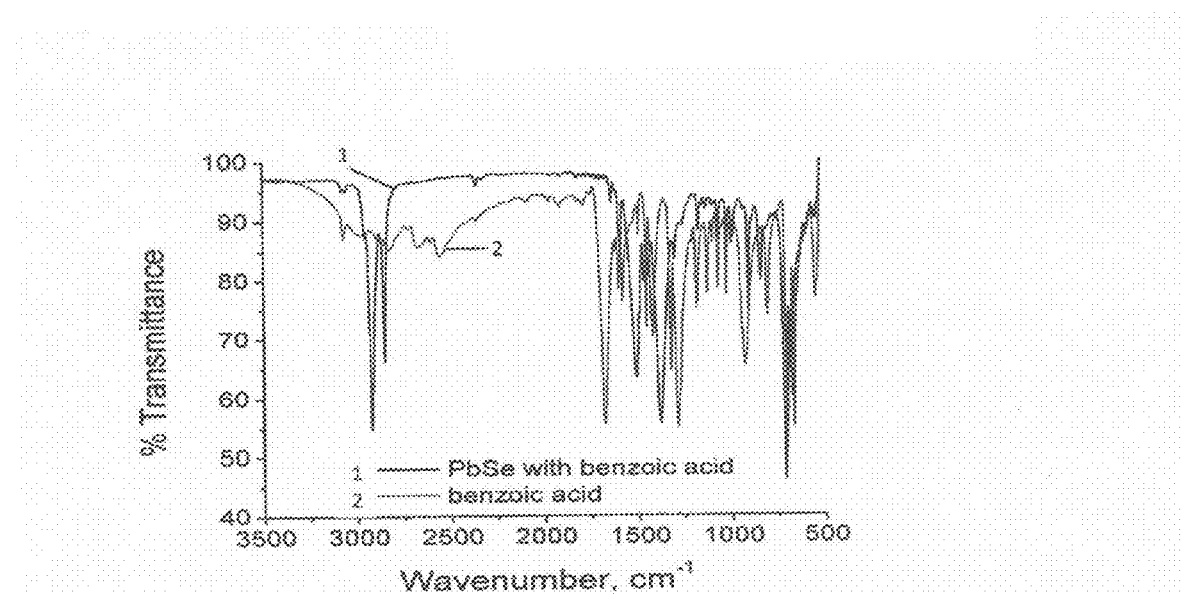
FIG. 3 shows an IR spectra of benzoic acid and of PbSe with benzoic acid as the capping ligand in accordance with the principles of the present disclosure.

FIG. 3 shows the IR spectra of benzoic acid as well as for the PbSe with benzoic acid as the capping ligand. The IR spectrum of benzoic acid shows the acidic —OH stretch at 3071 $cm^{-1}$ and the C=O stretch at 1670 $cm^{-1}$. Other bands are also present which are characteristic of this aromatic carboxylic acid compound. However, is very interesting that upon complexation of benzoic acid with PbSe (particularly with $Pb^{+2}$), the IR spectrum shows that the —OH stretch at 3071 $cm^{-1}$ is not present. This indicates complete complexation between the carboxylate group with the PbSe particle. To corroborate this finding, we also observed that the intensity of C=O stretching peak at 1670 $cm^{-1}$ was dramatically reduced, while the peak of the aromatic C=C vibrational stretch is present around 1500 $cm^{-1}$.

Figure 4:
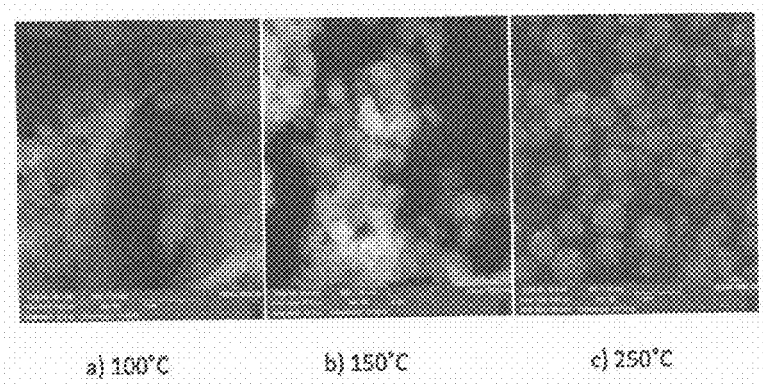
FIG. 4 shows a secondary electron detector SEM micrographs of PbSe with benzoic acid ligand at a) 100° C., b) 150° C. and c) 250° C. on a carbon tape substrate in accordance with the principles of the present disclosure.

FIG. 4 shows secondary electron detector SEM micrographs of PbSe with benzoic acid prepared at 100° C., 150° C. and 250° C. As can be observed in FIG. 4, the synthesis of PbSe with benzoic acid at 100° C. produces particles that have more like a laminar structure rather than crystals. When the temperature was increased during the synthesis, some agglomeration is observed. However, at 250° C. particles are present showing a spherical shape. The mean size of PbSe particles with benzoic acid prepared at 250° C. is around 500 nm as determined by SEM, which corroborates our previous results obtained in our XRPD studies (FIG. 2).

Figure 5:
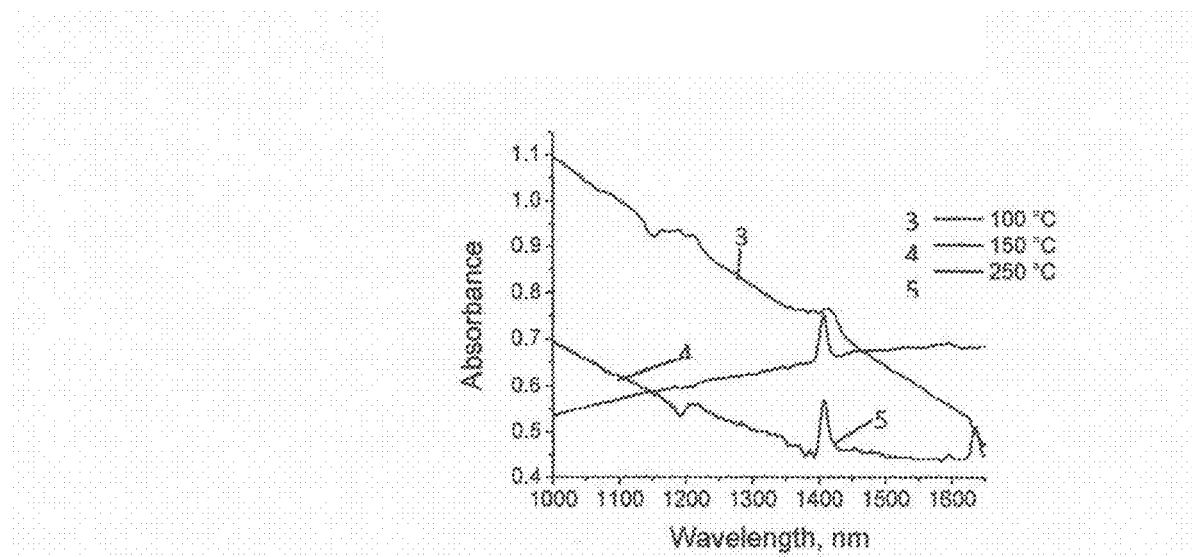
FIG. 5 shows an NIR absorption spectra of synthesized PbSe with benzoic acid at 100° C., 150° C. and 250° C. in accordance with the principles of the present disclosure.

FIG. 5 shows that PbSe with benzoic acid retained their electronic properties. PbSe with benzoic acid have a λmax around 1403 and 1630 nm, which are in agreement with previous results using oleic acid as the capping ligand.

Electrochemical Studies

Figure 6:
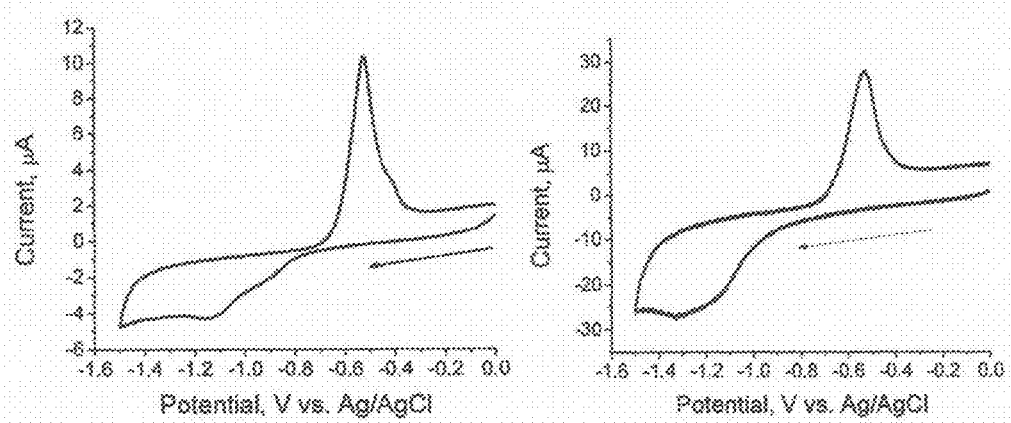
FIG. 6 shows a Cyclic voltammograms of PbSe with benzoic acid ligand on a glassy carbon electrode surface. At the left, the cyclic rate was 25 mV/s and at the right, the cyclic rate was 100 mV/s in accordance with the principles of the present disclosure.

A 500 μL of PbSe with benzoic acid solution (concentration of the sample=2 mg/mL) were drop-casted into the surface of a glassy carbon electrode. FIG. 6 shows the cyclic voltammograms for the electrochemical reduction process of benzoic acid at 25 mV and at 100 mV/s. The particles are electrochemically active in the region where Pb(II) reduces to metallic lead. This electrochemical process usually occurs in positive potentials. Due to the presence of aromatic ligands, and more specifically, benzoic acid, the electrochemical behavior of the PbSe of the present disclosure occurs in negative potentials. This result indicates that PbSe with benzoic acid is resistant to air and water oxidation.

Due to similar characteristics with benzoic acid, there are several ligands that can be used to synthesize robust and more durable lead selenide in an opened environment in accordance to the present invention. There are several commercially available aromatic ligand exchangers that can be employed for the attachment to a quantum dot core. They have a component that can be used for polymerization. Ligands such as 4-vinylbenzoic acid, 3-vinylbenzoic acid, which have a vinyl group have been known to produce films using electropolymerization at an electrode surface. Also 1-pyrenecarboxylic acid can be used as the capping ligand in accordance to the principles of the present invention.

What is claimed is:

1. A method for preparing a lead selenide with an aromatic ligand, which comprises the following steps:
    a. on a first container lead acetate and an aromatic ligand are added to a mixture of toluene and 1-octadecene generating a first reaction mixture;
    b. heating the first reaction mixture at a first temperature of about 250° C. and constantly stirring the first reaction mixture for about one hour to generate a lead aromatic solution;
    c. on a second container adding selenium powder and tri-octylphosphine to 1-octadecene generating a second reaction mixture;
    d. heating the second reaction mixture at a second temperature of about 250° C. and constantly stirring the second reaction mixture for about 20 to 30 minutes to generate a selenide solution; and
    e. adding the lead aromatic solution to the selenide solution generating a lead selenide with aromatic ligand and a byproduct.

2. The method according to claim 1, wherein the amounts of the lead acetate and the aromatic ligand is 1:1 in stoichiometric amounts.

3. The method according to claim 1, wherein the amount mixture of toluene and 1-octadecene is 40 mL of 50:50 toluene and 1-octadecene.

4. The method according to claim 1, wherein the amounts of the selenium powder is 1:1 in stoichiometric amounts with the lead acetate.

5. The method according to claim 1, wherein the amount of tri-octylphosphine is 1.6 mL.

6. The method according to claim 1, wherein the amount of 1-octadecene is 40 mL.

7. The method according to claim 1, wherein the lead aromatic solution added to the selenium solution is 5 ml at a rate of 1 mL per 30 seconds.

8. The method of claim 1, wherein the aromatic ligand is selected from a group consisting of: 4-vinylbenzoic acid, 3-vinylbenzoic acid, 1-pyrenecarboxylic acid and benzoic acid.

9. A method for preparing a lead selenide with a benzoic ligand, which comprises the following steps:
    a. on a first container lead acetate and recrystallized benzoic acid are added to a mixture of toluene and 1-octadecene generating a first reaction mixture;
    b. heating the first reaction mixture at a first temperature of about 200° C. and constantly stirring the first reaction mixture for about one hour to generate a lead benzoate solution;
    c. on a second container adding selenium powder and tri-octylphosphine to 1-octadecene generating a second reaction mixture;
    d. heating the second reaction mixture at a second temperature of about 200° C. and constantly stirring the second reaction mixture for about 20 to 30 minutes to generate a selenide solution; and
    e. adding the lead benzoate solution to the selenide solution generating a lead selenide with benzoic ligand and a byproduct.

10. The method according to claim 9, wherein the amounts of the lead acetate and the benzoic acid is 1:1 in stoichiometric amounts.

11. The method according to claim 9, wherein the amount mixture of toluene and 1-octadecene is 40 mL of 50:50 toluene and 1-octadecene.

12. The method according to claim 9, wherein the first temperature is preferably 250° C.

13. The method according to claim 9, wherein the amounts of the selenium powder is 1:1 in stoichiometric amounts with the lead acetate.

14. The method according to claim 9, wherein the amounts of lead acetate, recrystallized benzoic acid, and selenium powder are 3.795 grams, 1.8349 grams, and 0.0690 grams, respectively.

15. The method according to claim 9, wherein the amount of tri-octylphosphine is 1.6 mL.

16. The method according to claim 9, wherein the amount of 1-octadecene is 40 mL.

17. The method according to claim 9, wherein the second temperature is preferably 250° C.

18. The method according to claim 9, wherein the lead benzoate solution added to the selenium solution is 5 ml at a rate of 1 mL per 30 seconds.

19. A method for preparing a lead selenide with benzoic ligand, which comprises the following steps:
    a. on a first container adding 3.795 grams of lead acetate and 1.839 grams of recrystallized benzoic acid to 40 mL of a 50:50 mixture of toluene and 1-octadecene generating a first reaction mixture;
    b. heating the first reaction mixture at a first temperature of about 250° C. and constantly stirring the first reaction mixture for about one hour to generate a lead benzoate solution;
    c. on a second container adding 0.0690 grams of selenium powder and 1.6 mL of tri-octylphosphine to 40 mL of 1-octadecene generating a second reaction mixture;
    d. heating the second reaction mixture at a second temperature of about 250° C. and constantly stirring the second reaction mixture for about 20 to 30 minutes to generate a selenide solution; and
    e. adding the 5 mL of the lead benzoate solution to the selenide solution at a rate of 1 mL per 30 seconds to generate a lead selenide with benzoic ligand and a by product.

20. The method according to claim 19, wherein the by product is separated from the lead selenide with benzoic ligand, and the lead selenide with benzoic ligand is further centrifuged with ethanol; the ethanol is separated from the lead selenide with benzoic ligand, and the lead selenide with benzoic ligand is further re-suspended in hexane at room temperature.

* * * * *